(12) United States Patent
Cockshott et al.

(10) Patent No.: US 6,438,268 B1
(45) Date of Patent: Aug. 20, 2002

(54) VECTOR QUANTIZATION CODEBOOK GENERATION METHOD

(75) Inventors: William Paul Cockshott, Glasgow;
Robert Bartholomew Lambert,
Renfrewshire, both of (GB)

(73) Assignee: University of Strathclyde, Glasgow (GB)

( * ) Notice: Subject to any disclaimer, the term of this patent is extended or adjusted under 35 U.S.C. 154(b) by 0 days.

(21) Appl. No.: 09/284,826

(22) PCT Filed: Oct. 15, 1997

(86) PCT No.: PCT/GB97/02841

§ 371 (c)(1),
(2), (4) Date: Jun. 9, 1999

(87) PCT Pub. No.: WO98/18262

PCT Pub. Date: Apr. 30, 1998

(30) Foreign Application Priority Data

Oct. 23, 1996 (GB) ............................................. 9622055

(51) Int. Cl.[7] .............................. G06K 9/36; G06K 9/38; G06K 9/46
(52) U.S. Cl. ..................... 382/253; 382/224; 382/225
(58) Field of Search ................................. 382/253, 224, 382/225, 226, 227, 228, 159

(56) References Cited

U.S. PATENT DOCUMENTS 5,300,931 A  4/1994  Lindsay et al.
5,371,544 A  * 12/1994  Jacquin et al. .............. 348/398

FOREIGN PATENT DOCUMENTS

EP          0 444 717       9/1991

OTHER PUBLICATIONS

Nasrabadi N M et al: "A Multilayer Address Vector Quantization Technique", IEEE Transactions On Circuits And Systems, pp. 912–921, XPOOO160478, see paragraph III.B.

Riskin E A Et Al: "Index Assignment For Progressive Transmission Of Full–Search Vector Quantization", IEEE Transactions On Image Processing, vol. 3, No. 3, May 1, 1994, New York, pp. 307–312, XPOOO453368, see paragraph II; figure 1, see paragraph III.C.

* cited by examiner

Primary Examiner—Phuoc Tran
(74) Attorney, Agent, or Firm—Alston & Bird LLP

(57) ABSTRACT

A data compression system using vector quantization utilises a codebook or index tables constructed by finding a small set of points in an n-dimensional space which are representative of a much larger population. The space is partitioned such that the integrals of the probability density functions over all the subspaces are approximately equal and thereafter the centre of gravity of each subspace is taken to represent the subspace population. The partitioning is effected sequentially to map n-dimensional space into one dimensional code space.

11 Claims, 3 Drawing Sheets

VECTOR QUANTIZATION CODEBOOK GENERATION METHOD

FIELD OF THE INVENTION

The present invention relates to vector quantisation data compression and in particular to a method of constructing a codebook for use in vector quantisation data compression and to codebooks so constructed.

BACKGROUND OF THE INVENTION

When storing or transmitting large amounts of digital data it is often desirable to be able to compress the data to a significant extent to reduce storage space or transmission time. This need for compression is particularly acute when dealing with digital video which tends to involve extremely large amounts of data which must be handled at high speed (particularly for real-time applications such as video phone communication).

One technique used for compressing digital video is known as 'vector quantisation', where a codebook of reference patches (e.g. relatively small portions taken from one or more 'library' or 'archetypal' images) is utilised. In the simplest form of this technique, each image to be compressed is partitioned into a number of image patches and a matching (i.e. similar) reference patch selected for each image patch from the codebook by comparing patches on a pixel by pixel basis. The codebook index for each chosen reference patch is stored, together with the corresponding position vectors of the image patches (i.e. their position in the original image), to provide a compressed representation of the image. Provided that a copy of the codebook is available, an approximation to the original image can be constructed by using the stored codebook indices to recover the required set of reference patches and inserting these into an image frame using the respective stored image patch position vectors. The achievable degree of compression is a function of the size of the image patches into which the image is partitioned, larger patches allowing higher compression.

Simple vector quantisation techniques require an exhaustive search of the codebook for each image patch, a process which is extremely computationally expensive where large codebooks are used to maximise the quality of the compressed images and where large patches, necessitating a large number of pixel comparisons, are generated to maximise the compression ratio. One technique used to reduce this search overhead is known as 'hierarchical vector quantisation' (HVQ). This technique is described in 'Hierarchical Vector Quantisation of Perceptually Weighted Block Transforms'; N Chadda, M Vishwanath, and P A Chou; Proceedings of the Data Compression Conference; IEEE, 1995, pp3–12.

To illustrate HVQ, consider that it is desired to compress an individual digitised frame of a black and white video sequence where the frame is composed of an array of pixels each having an intensity value in the form of a byte-integer. suppose that the frame is divided into patches formed by pairs of horizontally adjacent pixels (so that each pair is represented by a pair of intensity values or a 2-D vector [i,j]) and a codebook $B_0$ is provided which contains a number of reference patches, each reference patch consisting of a pair of horizontally adjacent pixels and the number of reference patches in the codebook (e.g. 256) being considerably less than the total number of possible pixel pair patches. An index table $T_0$ is provided which maps every possible value of the 2-D vectors to associated codebook addresses, such that $T_0[i,j]$ addresses the closest entry in $B_0$ (i.e. $B_0[T_0[i,j]]$) to the vector [i,j]. Finding the closest entry in the codebook to a given input vector can then be determined simply by looking up the table $T_0$.

Consider now that the frame to be compressed is subdivided into patches of 2×2 pixels so that each patch is represented by a four dimensional vector of intensity values [i,j,k,l]. Each of these 4-D vectors is split into two 2-D -vectors and, using tables $T_0$, can be mapped to a further 2-D vector [$T_0[i,j]$, $T_0[k,l]$]. Suppose that a second codebook $B_1$ contains a number of 4-D vectors [p,q,r,s] which correspond to a set of four pixel patches (where again the number of patches is considerably less than the total number of possible four bit patches). A second level index table $T_1$ -is constructed such that $B_1[T_1[T_0[i,j], T_0[k,l]]]$ is the closest entry in $B_1$ to $[B_0[T_0[i,j]], B_0[T_0[k,l]]]$. Finding the closest entry in the codebook $B_1$ to a given input vector can then be determined by looking up the table $T_0$ for pixel pairs [i, j] and [k, l], and then applying the resultant 2-D vectors $T_o[i, j]$, $T_o[k, l]$ to the table $T_1$. This process is illustrated in FIG. 1.

In a non-HVQ process, it is necessary to provide a codebook containing 4-D vectors and, for each 4-D vector (or patch) in an image to be compressed, to compare each entry in that vector against the corresponding entry in each vector in the codebook. Such an exhaustive search process requires n×m comparison operations to find a matching vector, when n is the number of elements in the vector and m is the number of entries in the codebook. The HVQ process in contrast requires n−1 look-up steps to find a matching vector. Given that comparisons and look-ups are of approximately the same computational cost, it will be appreciated that n×m is much greater than n−1 for reasonable values of m and that the HVQ look-up process will be approximately m times faster than the exhaustive search.

For each further level of the index table ($T_2, T_3$ etc) added in the HVQ process, the compression ratio is increased further. It is noted that in practice, only the final level codebook B need be retained as the intermediate codebooks are not essential to carrying out the HVQ process.

Hierarchical vector quantisation may be used to compress colour images by separating out the three components of colour images (e.g. red, blue, green) and compressing them separately, and recombining the three sets of codebook reference patches to produce a decompressed image.

It will be clear that in order to use HVQ effectively, it is necessary to construct a series of tables $T_{0,1 \ldots m}$ and codebooks $B_{0,1 \ldots m}$ where m is $\log_2$ of the number of pixels in the largest patch used for compression. The conventional HVQ approach is to develop codebooks first, e.g. by extracting reference patches from a number of archetypal image frames, and then to derive the tables from the codebooks.

Since the patches at the final level m are twice the size of the patches at level m−1, the index table $T_m$ is constructed by taking all possible pairs of patches at level m−1 and by conducting an exhaustive search of patches in the codebook at level m to identify the patch at level m which is most similar. Thus, if the level m−1 patches 7 and 13 when placed together most closely resemble level m patch 100, $T_m[7,13]$ would be set to 100. This process is propagated back thorough the levels to create a codebook and an index table at each level.

In this approach, the selection of level m codebook patches taken from the archetypal image frames is essentially arbitrary. The result is that certain ones of these patches may never or only infrequently be selected as a match for a patch from an image to be compressed, resulting in an inefficient codebook.

SUMMARY OF THE INVENTION

It is an object of the present invention to overcome or at least mitigate disadvantages of conventional vector quantisation codebooks.

It is a second object of the present invention to provide a method of generating a vector quantisation codebook, wherein the entries in the codebook are used with substantially equal frequency when compressing data whose statistical properties mirror those of the training data used to construct the codebook.

According to a first aspect of the present invention there is provided a method of constructing a vector quantisation codebook from at least one archetypal data array composed of a set of data values, the method comprising:

1) selecting from the data array(s) a first multiplicity of n-dimension sample vectors, each sample vector consisting of a set of data values which are contiguous in the array(s) and each sample vector defining a point in a finite n-dimensional space;

2) partitioning said space into a predetermined number of regions, each region containing substantially the same number of sample vectors;

3) assigning to each said region a unique index, where the indices are selected to codify the partitioning process carried out in step 2);

4) determining for substantially all possible points within said space, the regions in which these points are located, and constructing a look-up index table mapping substantially all possible points to the respective region indices;

5) selecting from the data array(s) a second multiplicity of n-dimension sample vectors, each sample vector consisting of a set of contiguous data values, and replacing each of these sample vectors with the associated region index obtained by looking up the index table generated in step 4) to create a further data array or arrays;

6) iteratively repeating steps 1) to 5) for the further data array(s) and any subsequently generated further data array(s), wherein each index generated in the final iteration is derived from a set of $n^m$ dimension sample vectors in the archetypal data array(s), where m is the number of iterations carried out;

7) for each index generated in the final iteration, creating an $n^m$ dimension reference vector which is representative of the associated set of $n^m$ dimension sample vectors in the archetypal data array; and 8) constructing a codebook containing the reference vectors, where each index generated in the final iteration points to the location in the codebook of the corresponding reference vector.

The approach adopted is to find a small set of points in an n dimensional space which are representative of a much larger population. For an efficient coding all of these representative points should be equally frequently used. Assume that we have some information about the population to be represented, for instance an encoding of its probability density function over a regular grid in the n dimensional space. The task can then be split into two parts:

a) derive a partitioning of the n dimensional space into subspaces such that the integrals of the probability density functions over all of the subspaces are approximately equal; and b) find the 'centre of gravity' of each subspace and use this to represent the population within the subspace.

The problem is computationally difficult when one is working with high dimensional spaces of the type used for image compression—16 dimensions and up. The theory behind the present invention is that step a) can be made easier if it is performed on spaces of low dimensions (typically 2), which implies that the whole task would be easy if there were some way of splitting the partitioning problem in n dimensions down into a series of problems in lower dimensions. This approach of splitting things up becomes possible if as a result of performing a partitioning on say a 2 dimensional space we are able to perform an approximately distance preserving projection from 2-dimensional sub-manifolds of the original n-dimensional space into a 1-dimensional code space which is itself a metric space. Thus by repeated pairwise application of the submanifold reduction, we can transform say a 16 dimensional metric space into an 8 dimensional metric code space. Repeated application of the submanifold reduction process can then allow us to map 16 dimensional spaces onto one dimensional code spaces.

Preferably, in step 1), the selected vectors are distributed substantially evenly about said data array(s). More preferably, every data value is contained within at least one vector.

Preferably, step 5) comprises sub-dividing the data array (s) into said second multiplicity of sample vectors, so that every entry is contained within at least one vector. Alternatively however, the selected vectors may encompass only a fraction of the data array, where that fraction coincides with those areas from which the first multiplicity of sample vectors are subsequently chosen.

In one embodiment of the present invention, step 2) comprises: (a) determining the mean and variance of the distribution of vectors for each dimension of said space; (b) identifying that dimension for which the vectors have the greatest variance; and (c) dividing the space into two regions, a first region containing those vectors which have a value for the selected dimension which exceeds the mean value and a second region containing those vectors which do not. For each region, steps (a) to (c) are recursively repeated until the required number of regions is obtained. This number is determined by the desired size of the look-up index tables.

In an alternative embodiment of the invention, step 2) comprises determining the Principal Component (or regression line) of the vector distribution and then determining the mean of the Principal Component. The space is then split into two by a line perpendicular to the Principal Component and passing through the mean thereof to create two regions or sub-spaces. Each of these regions is in turn split, with the process continuing recursively until a desired number of regions is achieved.

Whilst the two partitioning operations set out above involve repeated applications of the same partitioning step, this is not an essential feature of the invention. In an alternative embodiment, two different partitioning steps could be applied alternatively in each partitioning operation.

The number of regions created by the partitioning operation is typically less than 1000 to 4000, e.g. 128 or 256. For higher numbers of regions, the computational complexity may be unmanageable.

Preferably, for each repeat of steps 1) to 4), the sequence in which the regions are created is used to determine the assignment of indices. In particular (for binary indices), the first split determines the most significant bit of the index, the second split the next most significant bit etc. The appropriate bit is set to 1 for the region containing vectors exceeding the mean and to 0 for the region containing vectors below the mean. It will be appreciated that a similar result can be achieved by replacing 1's with 0's and 0's with 1's.

Preferably, in step 3), the result of assigning the indices is that the indices preserve the order of the regions having regard to the average value of data values making up the vectors of each region.

The present invention is particularly applicable to creating codebooks for use in compressing digital images which comprise an array of image pixels, each defined by an intensity value. The vectors at the first level represent patches of contiguous pixels in an archetypal image frame whilst the vectors at the higher levels correspond to patches in a shrunk image. At each level, the regions are assigned indices which preserve the subjective order of the regions. For example, regions containing relatively dark patches are assigned relatively low indices whilst regions containing relatively bright patches are assigned relatively high indices.

Preferably, in step 1) of the above method, n=2. More preferably, in the first iteration, every pair of horizontally adjacent data values in the archetypal data array(s) is selected to provide the vectors for use in step 2) so that substantially all data values appear in two data value pairs. In step 5), the or each data array is sub-divided into horizontally adjacent pairs of data values so that each pair abuts the neighbouring pair(s). In the second iteration, in step 1) every pair of vertically adjacent data values are extracted whilst in step 5) [if the process comprises three or more iterations] the or each further data array is sub-divided into vertically adjacent pairs of data values. For each subsequent iteration, horizontally and vertically adjacent pairs of data values are chosen alternately.

Whilst the sample vectors of the first and second multiplicities preferably all have the same orientation, this is not essential. For example, there may be a mixture of horizontal and vertical patches in either of the multiplicities.

The above method is capable of producing optimised codebooks for use in any vector quantisation process. However, it is particularly suited to producing codebooks for use in hierarchical vector quantisation (HVQ) processes given that index look-up tables for each level, and which are necessary for HVQ, are an inherent product of the codebook creation method.

In certain embodiments of the above method, it may be desired to additionally carry out steps 7) and 8) at the end of each iteration so as to create a codebook at each level. This may be necessary, for example, where an image is to be compressed using variable sized reference vectors.

According to a second aspect of the present invention there is provided a method of constructing a vector quantisation codebook from at least one archetypal data array composed of a set of data values, the method comprising:

1) selecting from the data array(s) a first multiplicity of n-dimension sample vectors, each sample vector consisting of a set of data values which are contiguous in the array(s) and each sample vector defining a point within a finite n-dimensional space;

2) partitioning said space containing said sample vectors into a predetermined number of regions containing substantially the same number of vectors;

3) assigning to each said region a unique index, where the indices are selected to codify the partitioning process carried out in step 2);

4) determining for substantially all possible points within said space the regions in which these points are located, and constructing a look-up index table mapping substantially all such possible points to the respective region indices;

5) for each region, determining a reference vector which is representative of the sample vectors in that group; and 6) constructing a codebook containing the reference is vectors, where each index points to the location in the codebook of the corresponding reference vector.

According to a third aspect of the present invention there is provided a method of constructing a set of index tables for use in a hierarchical vector quantisation process, the tables being constructed from at least one archetypal data array composed of a set of data values, the method comprising:

1) selecting from the data array(s) a first multiplicity of n-dimension sample vectors, each sample vector consisting of a set of data values which are contiguous in the array(s) and each sample vector defining a point in a finite n-dimensional space;

2) partitioning said space into a predetermined number of regions, each region containing substantially the same number of sample vectors;

3) assigning to each said region a unique index, where the indices are selected to codify the partitioning process carried out in step 2);

4) determining for substantially all possible points within said space, the regions in which these points are located, and constructing a look-up index table mapping substantially all possible points to the respective region indices;

5) selecting from the data array(s) a second multiplicity of n-dimension sample vectors, each vector consisting of a set of contiguous data values, and replacing each of these sample vectors with the associated region index obtained by looking up the index table generated in step 4) to create a further data array or arrays; and 6) iteratively repeating steps 1) to 5) for the further data array(s) and any subsequently generated further data array(s), wherein each index generated in the final iteration is derived from a set of $n^m$ dimension sample vectors in the archetypal data array(s), where m is the number of iterations carried out.

The method of the above third aspect of the present invention is able to generate a set of index tables for use in applications where it is desired to encode data but where it is not necessary to be able to reconstruct the original data from the encoded data, i.e. where a codebook is unnecessary.

The term 'archetypal' used above encompasses real images captured, for example, using a camera. However, the term also encompasses artificially generated images such as pre-existing codebooks

BRIEF DESCRIPTION OF THE DRAWINGS

For a better understanding of the present invention and in order to show how the same be carried into effect reference will now be made, by way of example, to the accompanying drawings, in which.

DETAILED DESCRIPTION OF THE INVENTION

Figure 1:
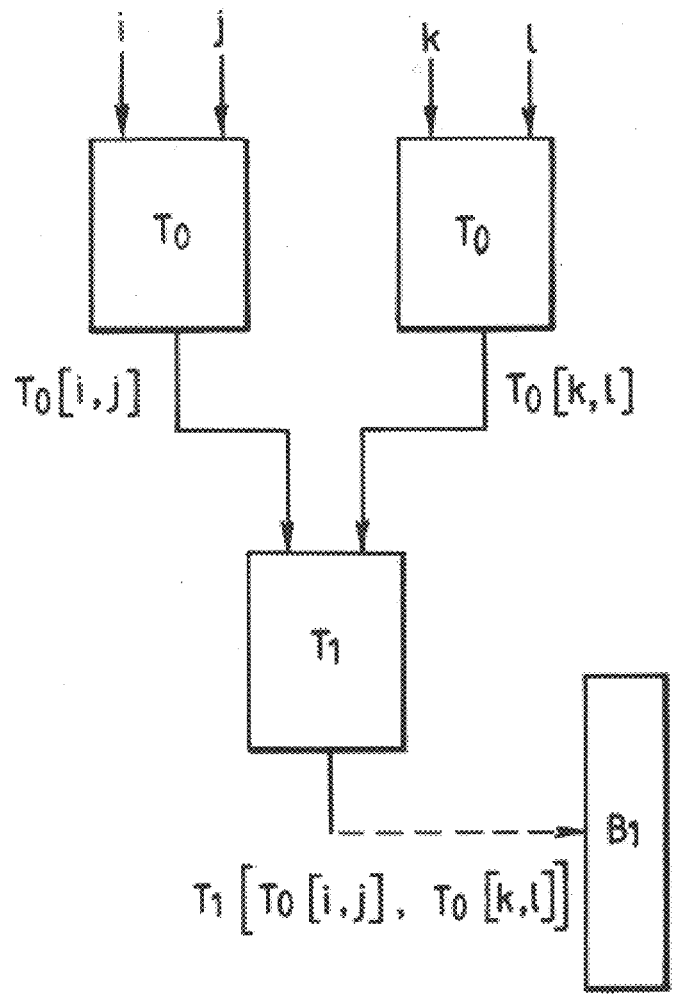
FIG. 1 illustrates schematically a two layer hierarchical vector quantisation process.
Figure 2:
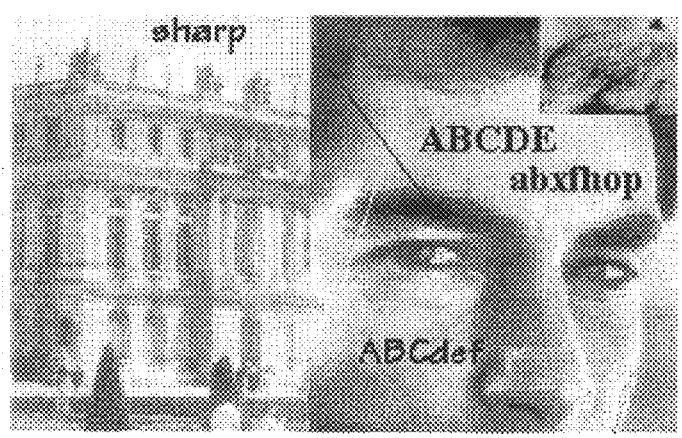
FIG. 2 illustrates a 2-D digital image frame for compression.

There is shown in FIG. 2 a two dimensional black and white digital image which is composed of 320×200 pixels. The brightness level or intensity of each pixel is defined within the range 0 to 256 (i.e. by an 8-bit binary integer). Suppose that it is desired to compress the image of FIG. 2 by a factor of 4 using a hierarchical vector quantisation process. This process is illustrated in FIG. 1 and has been described above. The image is firstly sub-divided into regular 2×2 pixel image patches. Each of these patches is then divided into upper and lower pixel pairs. For each patch in turn, the upper and lower pairs are fed in parallel to identical first level look-up tables $T_0$ to derive the first level indices for each pair. The resulting pair of indices are then fed to a second level look-up table $T_1$ to derive a second level index which addresses a reference patch in a codebook. A compressed representation of the image is created by storing only the positions in the image of each of the image patches and the respective indices. In order to decompress the data, it is only necessary to access the codebook, or a copy of the codebook, using the indices and to correctly order the resulting reference patches.

It follows from a basic concept of information theory that the most efficient codebook is that which contains only patches which are likely to occur in an image to be compressed with equal frequency. In contrast, a codebook which contains patches which are never, or only infrequently, used when compressing images will be extremely inefficient. As noted above, codebooks are generally created using a set of test or archetypal images which are expected to be typical of images to be compressed. Therefore, if the patches in the codebook occur with substantially equal frequency in the test images, it is likely that these patches will also occur with equal frequency in images to be compressed.

Figure 3:
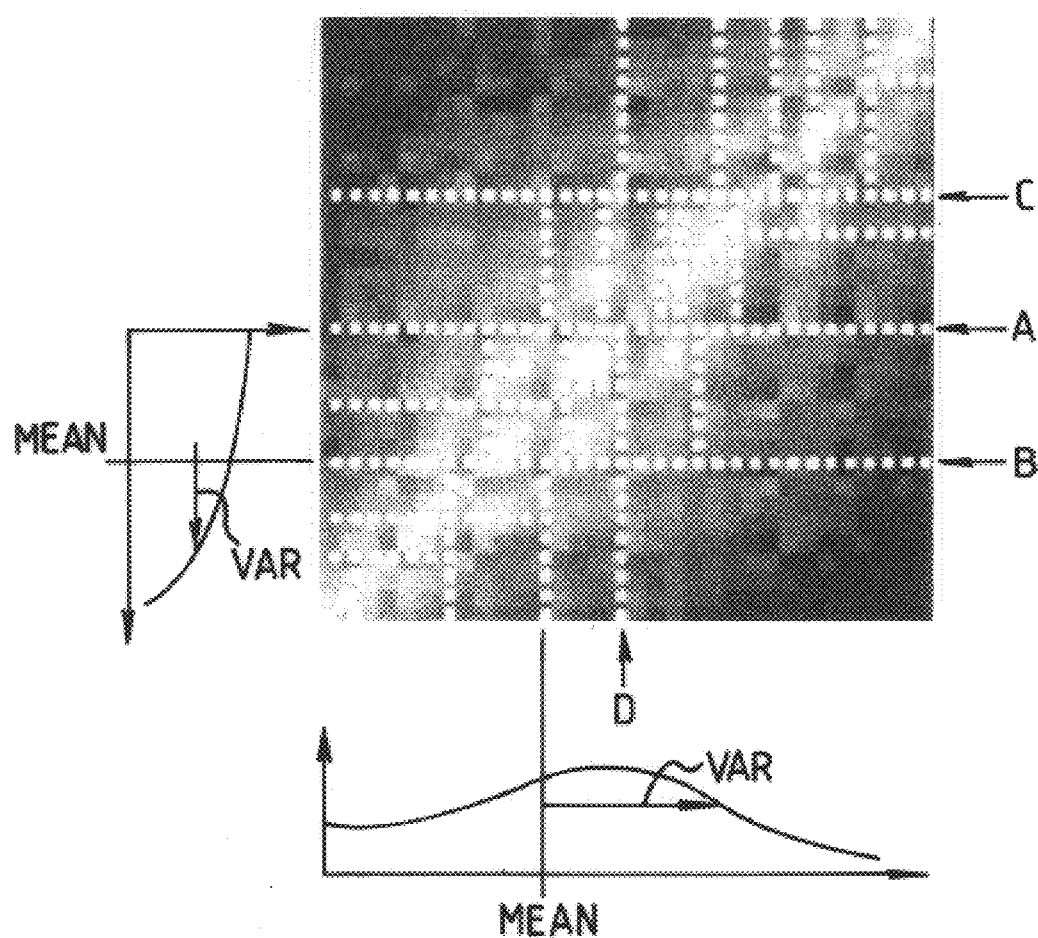
FIG. 3 shows a first level frequency map obtained from the image frame of FIG. 2.

The first step in constructing a codebook of 2×2 pixel patches suitable for compressing the image frame of FIG. 2, is to extract every pair of horizontally adjacent pixels from a digital archetypal image (in this case the image frame of FIG. 2 may be considered an archetypal image) such that every pixel, other than pixels at the edges of the frame, appear in two different pairs. As already noted, the archetypal image is selected to have similar properties to images to be compressed. The intensities of the right and left pixels of each pair are then plotted against each other in a two dimensional space to obtain a first level frequency map (or occurrence map) which shows the intensity distribution of the pixel pairs. The map for the image of FIG. 2 is shown in FIG. 3 where, for the purpose of illustration, bright areas correspond to a high density of similar pixel pairs whilst dark areas correspond to a low density of similar pixel pairs. In a typical image, adjacent pairs of pixels will tend to have similar intensities (except where a pixel pair straddles a sharp edge) resulting in a high intensity band running across a diagonal of the frequency map from the bottom left of the map to the top right.

The intensity distribution is then determined for both axes of the map. The distribution for the x-axis is illustrated alongside the x-axis. From the distributions, it is possible to determine the mean, and hence the variance, of the distribution with respect to each axis. The frequency map is then partitioned into two regions by a partitioning line (in this case it is the line denoted A) parallel to the axis having the least variance and passing through the mean intensity of the other axis to create two new sub-maps. It will be apparent that both of these sub-maps will contain approximately the same number of pixel pairs. Taking each of the new sub-maps separately, and by way of illustration the intensity distribution for the y-axis of one of the sub-maps is shown in FIG. 3, this process is repeated recursively so as to create further frequency sub-maps (by partitioning along the appropriate partitioning lines B, C and D) each of which again contains approximately the same number of pixel pairs. The process is repeated until the number of sub-maps or groups equals the desired number of entries in the first level codebook, e.g. 256.

As the sub-map creation process proceeds, indices or identifiers are dynamically assigned to the sub-maps to codify the partitioning process. For the case where 256 sub-maps are to be created, 8-bit binary indices are required. The first split in the process determines the most significant bit of the index, the second split the next most significant bit etc. Also, where a horizontal split occurs, e.g., by partitioning line A, the relevant bit for the upper sub-map is set to 1 and that for the lower sub-map is set to 0. Where a vertical split occurs, e.g., by partitioning line D, the relevant bit for the right sub-map is set to 1 whilst that for the left sub-map is set to 0. The result is a set of indices which tend to preserve the subjective intensity of the maps. For example, the sub-map at the top right of FIG. 3 will have the highest index, corresponding to a high intensity, whilst that at the bottom left will have the lowest index, corresponding to a low intensity.

Each of the sub-maps or groups encompasses a region of the frequency map and each point within the total space falls within a sub-map. A first level look-up index table $T_o$ is created which contains every possible point in the space, where each point is mapped to the index for the sub-map in which that point is located. For example, where the pixel intensities range from 0 to 255, the index table $T_0$ will contain 256×256 entries.

For each sub-map, a 2×1 pixel reference patch is then created by obtaining the mean intensity values for the right and left pixels of all of the pixel pairs which comprise that sub-map. These reference patches are then stored as a first level codebook $B_0$, where the location in the codebook of a reference patch is pointed to by the associated index.

Figure 4:
FIG. 4 shows a first level shrunk image frame obtained from the image frame of FIG. 2 using the frequency map of FIG. 3.

The next step in the codebook creation process is to sub-divide the test image into pairs of horizontally adjacent pixels and to replace each of these pairs with the associated first level index. This results in an image which is shrunk from left to right as shown in FIG. 4. An important point to note is that, because the indices preserve the intensity order of the sub-maps, the first level shrunk image remains recognisable.

Figure 5:
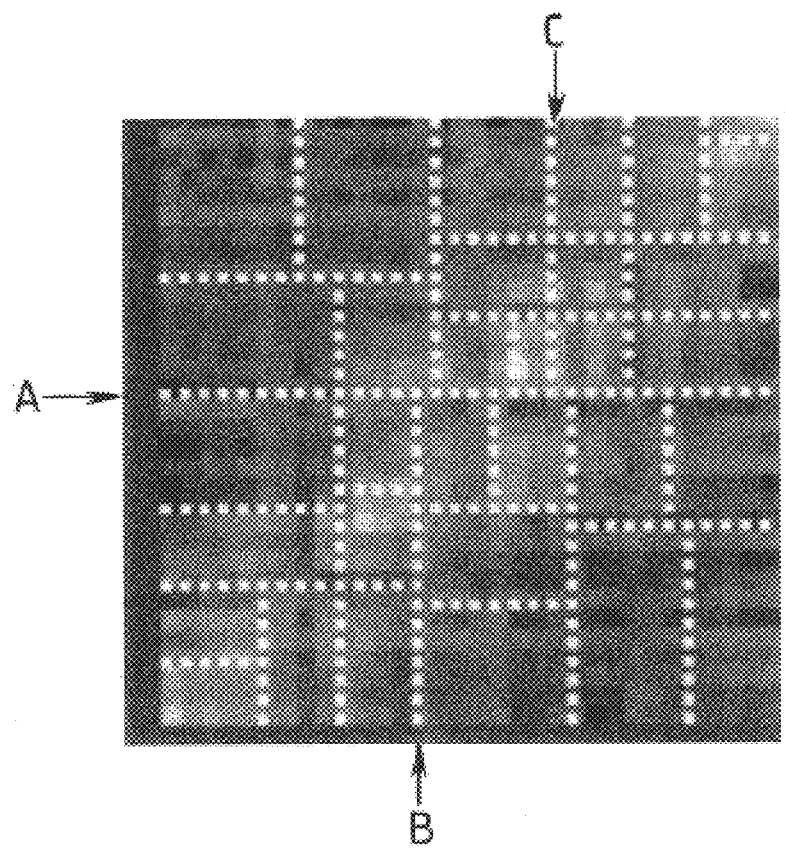
FIG. 5 shows a second level frequency map obtained from the image of FIG. 4.
Figure 6:
FIG. 6 shows a second level shrunk image frame obtained from the image frame of FIG. 2 using the frequency map of FIG. 5.

A second level frequency map is next created from the first level shrunk image, only this time every pair of vertically adjacent pixels are extracted and the intensities of the upper and lower pixels plotted against each other. This is illustrated in FIG. 5, which also shows the result of partitioning the map in the way set out above. Indices are again dynamically assigned.

It will be appreciated that each pixel in the first level shrunk image is an index which is mapped to a two pixel reference patch in the first level codebook $B_0$ and that each entry in the second level frequency map therefore corresponds to a 2×2 patch of pixels. For each map of the second level frequency map therefore, a 2×2 pixel reference patch can be created by determining the mean values for the four pixels from each of the patches in that map. A second level index look-up table To is constructed which contains every possible combination of vertically adjacent first level indices together with the associated second level indices. A second level codebook is then constructed to contain the reference patches, where the location of a reference patch is pointed to by the associated second level index.

If it is desired to achieve a higher compression ratio than can be achieved with 2×2 pixel codebook patches, the process can be iteratively repeated to create a third level codebook (4×2 pixel patches), a fourth level codebook (4×4 pixel patches) etc.

A surprising advantage of the present invention is that it may provide a compressed representation of a data array which is tolerant to the loss of least significant bit (lsb) data from index byte-integers. This is because these indices preserve the subjective order of the codebook patches which they represent. Thus, the patches pointed to by indices 00110010 and 00110011 will tend to be similar so that an error in the lsb of an index, whilst resulting in the selection of the incorrect patch for the decompressed image, will not substantially distort that image. It is common in many digital transmission systems to only transmit error correction codes for the most significant bits of digital data (e.g. GSM cellular phones). It will be apparent therefore that the method of the present invention is ideally suited to transmission by such transmission systems. Furthermore, the tolerance of the compressed representations resulting from the present invention enables increased compression ratios to be obtained merely by removing one or more lsb's from the indices.

The method set out above involves repeatedly partitioning the frequency maps at each level into two using either a horizontal or a vertical axis. By performing the partitioning along the axis of greatest variance it is ensured that the expected distances between the map entries and the means of the new sub-maps is lower than would be the case if the sub-maps are partitioned along the axis of least variance. This principle can be exploited further by determining the variance along more than two axes. One practical method of achieving this is to calculate the Principal Component of the frequency map. This is described in 'Negative feedback as an organising principle for Artificial Neural Nets', Ph. D. Thesis, Strathclyde University, UK. The map is partitioned by a line extending at right angles to the Principal Component and passing through the mean of the Component. The process is repeated for each sub-map.

It will be appreciated that various modifications may be made to the above described embodiment without departing from the scope of the present invention. For example, colour image frames may be compressed by considering each primary colour separately. The same codebook may be used for each colour.

In some vector quantisation methods, compression is performed on image patches whose mean and variance values have been pre-normalised. In order to reconstruct the original image, the codebook indices are stored/transmitted along with the mean and variance values of the original patches. Codebooks for use with these methods comprise reference patches which also have their mean and variance values normalised. When preparing codebooks of this type it is appropriate to avoid biasing the frequency map with a lot of entries drawn from patches having a low variance since, when a patch of low variance is sent, most of the transmitted information is encoded in the value for the mean of the patch. The construction of codebooks can therefore be improved by pre-processing the training set to remove patches having a low variance. This can readily be done by making the probability that a patch is retained in the training set to be some increasing function of its variance.

For certain applications it may only be necessary to construct the look-up index tables, the actual codebooks being unnecessary. Consider for example the situation where it is desired to recognise a human face for the purpose of security. A set of index tables are generated as described above. Using a HVQ process, images of the faces of persons having security clearance are encoded, the result for each image being an array of indices at the final level. [If a codebook had been created, these indices would address respective patches in the codebook.] These arrays are stored in a database. When a person requires security clearance, an image of their face is obtained and is encoded using the HVQ process. The resulting array of indices is then compared against those stored in the database.

What is claimed is:

1. A method of constructing a vector quantisation codebook from at least one archetypal data array composed of a set of data values, the method comprising:

1) selecting from the data array(s) a first multiplicity of n-dimension sample vectors, each sample vector consisting of a set of data values which are contiguous in the array(s) and each sample vector defining. a point in a finite n-dimensional space;

2) partitioning said space into a predetermined number of regions, each region containing substantially the same number of sample vectors;

3) assigning to each said region a unique index, where the indices are selected to codify the partitioning process carried out in step 2);

4) determining for substantially all possible points within said space, the regions in which these points are located, and constructing a look-up index table mapping substantially all possible points to the respective region indices;

5) selecting from the data array(s) a second multiplicity of n-dimension sample vectors, each sample vector consisting of a set of contiguous data values, and replacing each of these sample vectors with the associated region index obtained by looking up the index table generated in step 4) to create a further data array or arrays;

6) iteratively repeating steps 1) to 5) for the further data array(s) and any subsequently generated further data array(s), wherein each index generated in the final iteration is derived from a set of $n^m$ dimension sample vectors in the archetypal data array(s), where m is the number of iterations carried out;

7) for each index generated in the final iteration, creating an $n^m$ dimension reference vector which is representative of the associated set of $n^m$ dimension sample vectors in the archetypal data array; and 8) constructing a codebook containing the reference vectors, where each index generated in the final iteration points to the location in the codebook of the corresponding reference vector.

2. The method of claim 1 wherein, in step 1, the selected vectors are distributed substantially evenly about said data array(s).

3. The method of claim 1, wherein step 5) comprises sub-dividing the data array(s) into said second multiplicity of sample vectors, so that every entry is contained within at least one vector.

4. The method of claim 1, wherein step 2) comprises: (a) determining the mean and variance of the distribution of vectors for each dimension of said space; (b) identifying that dimension for which the vectors have the greatest variance; and (c) dividing the space into two regions, a first region containing those vectors which have a value for the selected dimension which exceeds the mean value and a second region containing those vectors which do not.

5. The method of claim 1, wherein step 2) comprises determining the Principal component (or regression line) of the vector distribution in the space, and then determining the mean of the Principal Component, then splitting the space into two by a line perpendicular to the Principal Component and passing through the mean thereof to create two regions or sub-spaces.

6. The method of claim 4, wherein in alternative repetitions, step 2) comprises determining the Principal Component (or regression line) of the vector distribution in the space, and then determining the mean of the Principal Component, then splitting the space into two by a line perpendicular to the Principal Component and passing through the mean thereof to create two regions or subspaces.

7. The method of claim 5, wherein in alternative repetitions step 2) comprises: (a) determining the mean and variance of the distribution of vectors for each dimension of said space; (b) identifying that dimension for which the vectors have the greatest variance; and (c) dividing the space into two regions, a first region containing those vectors which have a value for the selected dimension which exceeds the mean value and a second region containing those vectors which do not.

8. The method of claim 1, wherein for each repeat of steps 1) to 4), the sequence in which the regions are created is used to determine the assignment of indices.

9. The method of claim 8, wherein in alternative repetitions for binary indices, the first split determines the most significant bit of the index, the second split the next most significant bit and so on.

10. A method of constructing a vector quantisation codebook from at least one archetypal data array composed of a set of data values, the method comprising:

1) selecting from the data array(s) a first multiplicity of n-dimension sample vectors, each sample vector consisting of a set of data values which are contiguous in the array(s) and each sample vector defining a point within a finite n-dimensional space;

2) partitioning said space containing said sample vectors into a predetermined number of regions containing substantially the same number of vectors;

3) assigning to each said region a unique index, where the indices are selected to codify the partitioning process carried out in step 2);

4) determining for substantially all possible points within said space the regions in which these points are located, and constructing a look-up index table mapping substantially all such possible points to the respective region indices;

5) for each region, determining a reference vector which is representative of the sample vectors in that group; and 6) constructing a codebook containing the reference vectors, where each index points to the location in the codebook of the corresponding reference vector.

11. A method of constructing a set of index tables for use in a hierarchical vector quantisation process, the tables being constructed from at least one archetypal data array composed of a set of data values, the method comprising:

1) selecting from the data array(s) a first multiplicity of n-dimension sample vectors, each sample vector consisting of a set of data values which are contiguous in the array(s) and each sample vector defining a point in a finite n-dimensional space;

2) partitioning said space into a predetermined number of regions, each region containing substantially the same number of sample vectors;

3) assigning to each said region a unique index, where the indices are selected to codify the partitioning process carried out in step 2);

4) determining for substantially all possible points within said space, the regions in which these points are located, and constructing a look-up index table mapping substantially all possible points to the respective region indices;

5) selecting from the data array(s) a second multiplicity of n-dimension sample vectors, each vector consisting of a set of contiguous data values, and replacing each of these sample vectors with the associated region index obtained by looking up the index table generated in step 4) to create a further data array or arrays; and 6) iteratively repeating steps 1) to 5) for the further data array(s) and any subsequently generated further data array(s), wherein each index generated in the final iteration is derived from a set of $n^m$ dimension sample vectors in the archetypal data array(s), where m is the number of iterations carried out.

* * * * *